(12) United States Patent
Tokita et al.

(10) Patent No.: US 7,807,065 B2
(45) Date of Patent: Oct. 5, 2010

(54) PROCESSING METHOD

(75) Inventors: Toshinobu Tokita, Yokohama (JP);
 Hirohisa Ota, Kawagoe (JP); Eigo Kawakami, Utsunomiyua (JP);
 Kazuyuki Kasumi, Utsunomiyua (JP)

(73) Assignee: Canon Kabushiki Kaisha (JP)

( * ) Notice: Subject to any disclaimer, the term of this patent is extended or adjusted under 35 U.S.C. 154(b) by 782 days.

(21) Appl. No.: 11/608,009

(22) Filed: Dec. 7, 2006

(65) Prior Publication Data

US 2007/0132157 A1 Jun. 14, 2007

(30) Foreign Application Priority Data

Dec. 9, 2005 (JP) .............................. 2005-356643

(51) Int. Cl.
 *B44C 1/22* (2006.01)
 *C03C 15/00* (2006.01)
 *C03C 25/68* (2006.01)
 *C23F 1/00* (2006.01)

(52) U.S. Cl. .......................................... 216/44; 216/54

(58) Field of Classification Search ................... 216/44, 216/54
 See application file for complete search history.

(56) References Cited

U.S. PATENT DOCUMENTS

| | | | |
|---|---|---|---|
| 6,078,640 | A | 6/2000 | Hasegawa et al. |
| 6,087,053 | A | 7/2000 | Hara |
| 6,258,492 | B1 | 7/2001 | Miyachi |
| 6,334,960 | B1 | 1/2002 | Willson et al. |
| 2002/0094496 | A1 * | 7/2002 | Choi et al. ................... 430/322 |
| 2004/0008334 | A1 * | 1/2004 | Sreenivasan et al. .......... 355/72 |

FOREIGN PATENT DOCUMENTS

| | | |
|---|---|---|
| JP | H10-312957 | 11/1998 |
| JP | H11-074190 | 3/1999 |
| JP | 2000-137319 | 5/2000 |

* cited by examiner

*Primary Examiner*—Roberts Culbert
(74) *Attorney, Agent, or Firm*—Rossi, Kimms & McDowell LLP (57) ABSTRACT

A processing method for forming a first pattern on a substrate to which a resist is applied includes the steps of pressing an original having a second pattern that has a relief reverse to that of the first pattern, against the resist on the substrate, and irradiating light onto the resist via the original, wherein a size of a concave of the second pattern is greater than a size of a convex of the first pattern corresponding to the concave of the second pattern, and a size of a convex of the second pattern is smaller than a size of a concave of the first pattern corresponding to the convex of the second pattern.

2 Claims, 10 Drawing Sheets

PROCESSING METHOD

BACKGROUND OF THE INVENTION

The present invention relates generally to a processing method, and more particularly to a processing method that transfers a pattern of an original onto a resist applied substrate. The present invention is suitable, for example, for a processing method that utilizes photo-curing type nanoimprint lithography for fine processing used to manufacture Micro Electro-Mechanical Systems ("MEMS"), photonic crystal, and an optical element.

Nanoimprint is one known alternative technology to a fine pattern forming method for a semiconductor device that utilizes the photolithography with the ultraviolet ("UV"), X-ray, and an electron beam. The nanoimprint is a technology that presses an original (also referred to as a "mold" or a "template") on which a fine pattern is formed by the electron-beam lithography etc., against a substrate such as a wafer to which a resinous material (resist) is applied, thereby transferring the pattern onto the resist.

A photo-curing method is proposed as conventional nanoimprint lithography. See, for example, U.S. Pat. No. 6,334,960. The photo-curing method is a method of exposing the UV-curing resin as the resist while pressing a transparent mold against the resist, and of releasing the mold after the resin is cured.

Other prior art include Japanese Patent Applications, Publication Nos. 11-074190, 10-312957, and 2000-137319.

However, the conventional photo-curing method cannot maintain the intended pattern transferring precision. In general, in the photo-curing method, the original is made of UV-transparent quartz, which is a highly rigid material. It is known that the UV-curing resin causes volume shrinkage, for example, by about 7% to about 10% in the UV curing course from liquid to solid. On the other hand, the original is made of a highly rigid material, and the volume shrinkage is negligible. The instant inventors have discovered that when the UV light is irradiated while the original is pressed against the UV-curing resin, a volume shrinkage factor of the UV-curing resin differs according to locations due to the rigidity of the original, the surface tension of the UV-curing resin, and the uneven surface free energy (interfacial tension) of the original. In other words, a simply entirely enlargement of the original's pattern by about 7% to about 10% does not result in a desired pattern since the shrinkage factor differs according to locations or since the shrinkage is distorted.

The wafer size varies in the semiconductor device manufacture after undergoing various processes, such as a heat treatment. Therefore, as disclosed in Japanese Patent Applications, Publication Nos. 11-074190, 10-312957, and 2000-137319, in pattern transferring, a correction in accordance with the wafer's magnification is needed for the original by means of the temperature and the load. This correction is often referred to as a "magnification correction." Different from the volume shrinkage, the magnification correction is a uniform correction for the entire original or substrate. However, since the original is highly rigid, a magnification correction needs a heavy load and a great temperature change, causing a deformation of the original and a deteriorated pattern transferring precision. In addition, use of wide-range load or temperature control mechanism would make the apparatus structurally complicated, increase its size and the cost, and lower the throughput.

SUMMARY OF THE INVENTION

The present invention is directed to a processing method that easily provides highly precise pattern transfer utilizing the photo-curing type nanoimprint lithography.

A processing method according to one aspect of the present invention for forming a first pattern on a substrate to which a resist is applied includes the steps of pressing an original having a second pattern that has a relief reverse to that of the first pattern, against the resist on the substrate, and irradiating light onto the resist via the original, wherein a size of a concave of the second pattern is greater than a size of a convex of the first pattern corresponding to the concave of the second pattern, and a size of a convex of the second pattern is smaller than a size of a concave of the first pattern corresponding to the convex of the second pattern.

A processing method according to another aspect of the present invention for forming a pattern on a substrate using a transfer pattern on an original includes the steps of pressing an original against a resist that is applied to the substrate, and irradiating light for exposing the resist onto the resist via the original, a concave in the original having a taper shape from an opening to a bottom of the concave.

A processing method according to another aspect of the present invention that utilizes a processing apparatus that transfers a pattern of an original to a substrate by pressing the original against a resist that is applied to the substrate, and irradiates light for exposing the resist onto the resist via the original includes the steps of producing a first daughter to which a pattern of a master is transferred, and producing a second daughter to which the pattern of the master is transferred, the second daughter being different in size from the first daughter, the processing apparatus using one of the first and second daughters as the original.

An original according to another aspect of the present invention used for a processing apparatus that presses, in order to form a first pattern on a substrate to which a resist is applied, the original against the resist on the substrate, and irradiates light onto the resist via the original includes a second pattern that is reverse to the first pattern, and a mechanism that enlarges a surface tension of the resist in the concave of the second pattern with a movement toward a bottom from an opening of the concave.

An original according to still another aspect of the present invention used for a processing apparatus that presses, in order to form a first pattern on a substrate to which a resist is applied, the original against the resist on the substrate, and irradiates light onto the resist via the original includes a second pattern that has a relief reverse to the first pattern, a size of at least part of a concave of the second pattern being greater than a size of a convex of the first pattern corresponding to the concave of the second pattern, and a size of at least part of a convex of the second pattern being smaller than a size of a concave of the first pattern corresponding to the convex of the second pattern.

A device manufacturing method according to still another aspect of the present invention includes the steps of transferring a pattern of an original onto a resist on a substrate by using the above processing method, and etching the substrate.

Other objects and further features of the present invention will become readily apparent from the following description of the preferred embodiments with reference to accompanying drawings.

DESCRIPTION OF THE EMBODIMENTS

Figure 1:
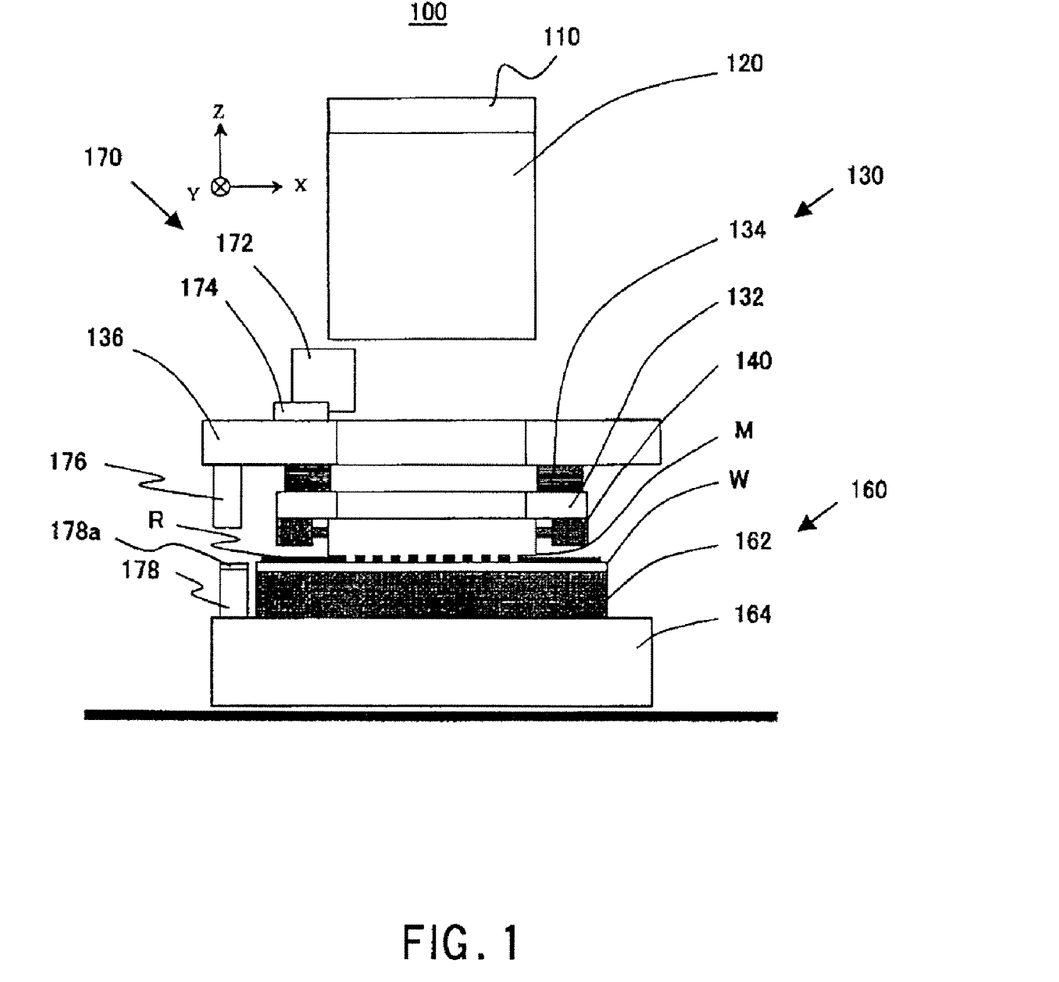
FIG. 1 is a schematic sectional view of a processing apparatus or a nanoimprint apparatus according to one embodiment of the present invention.

Referring now to the accompanying drawings, a description will be given of a photo-curing type nanoimprint apparatus or processing apparatus 100 that serves as a processing apparatus according to one embodiment of this invention. Here, FIG. 1 is a schematic sectional view of the nanoimprint apparatus 100.

The nanoimprint apparatus 100 includes a photo-curing means (110, 120), an original M, an original driver 130, a magnification correction mechanism 140, a wafer or substrate W, a wafer driver 160, and an alignment mechanism 170.

The photo-curing means is a means for irradiating the UV onto a resist R via the original M and for curing the UV-curing resin (resist) R, and includes light source section 110, and illumination optics 120.

The light source section 110 has light source, such as a halogen lamp (e.g., an i-line and a g-line), for generating the UV light, and an elliptical mirror for condensing the light from the light source.

The illumination optics 120 include a lens and an aperture that shape the curing illumination light and irradiate the light to the resist plane so as to expose and cure the resist R as the UV-curing resin. The aperture is used for the angle-of-field control and the circumference shielding control. The angle-of-field control leads to an illumination of only a desired shot, and the circumference shielding control blocks the UV illumination beyond the outline of the wafer W. The illumination optics 120 may include an optical integrator for uniformly illuminating the original M if necessary. The light defined by the aperture is introduced to the resist R via the original M and imaging optics.

The original M has a fine pattern to be transferred, and is made of a transparent material that transmits the UV light for curing the resist R. The original M in this embodiment is made of quartz. The original M is fed by original feeding means (not shown) that includes, for example, an original feeding robot that holds the original M using a hand with vacuum attraction and feeds it.

Figure 2A:
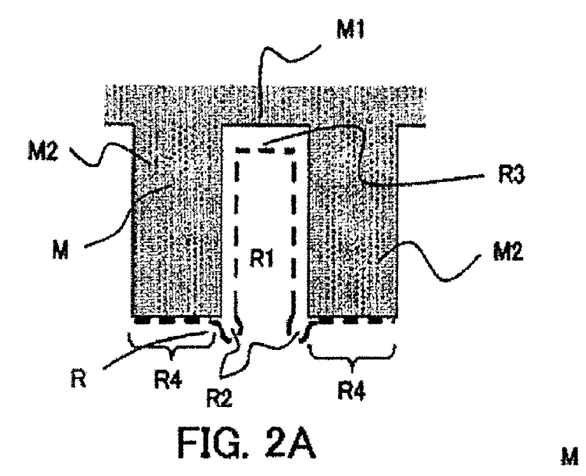
FIG. 2A is a partial sectional view of an original if the volume shrinkage of the resist shown in FIG. 1 is not considered.

The resist R incurs the volume shrinkage by several % to about 10% when curing due to the UV irradiation, causing a problem of the lowered pattern transferring precision. When the UV light is irradiated while the original is being pressed against the UV-curing resin, the volume shrinkage factor is not uniform due to the high rigidity of the original and the surface tension of the UV-curing resin. On investigation of the locations of the volume shrinkage, the instant inventors have discovered that when the original M has a concave M1 and convexes M2 shown in FIG. 2A, the hardened resist R shrinks as shown by a broken line. In other words, as shown in FIG. 2A, the volume shrinkage is conspicuous at (1) an entire convex R1 of the resist R, (2) a root R2 of the convex of the resist R, and (3) a top of the convex R3 of the resist R in the height direction. Since the original M is made of a highly rigid material or quartz, the volume shrinkage of the resist R at each concave bottom R4 is negligible. Here, FIG. 2A is a schematic partial sectional view of the original M having a pattern whose relief is simply reverse to that of a pattern to be transferred.

Figure 2B:
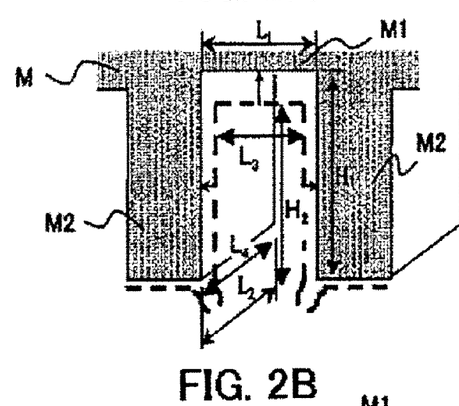
FIGS. 2B to 2E are partial sectional views of various originals applicable to the original shown in FIG. 1.

The volume shrinkage of the entire convex R1 of the resist R is general volume shrinkage associated with the UV cure. The width, length and height of the relief of the original M are determined from the volume shrinkage factor of the resist R and the transferred pattern's size. Assume, as shown in FIG. 2B, that the resist R has a volume shrinkage factor "a," and the original M has a concave width L1, a length L2, and a height or depth H1. Here, FIG. 2B is a schematic partial section of the original M having a varied pattern size so as to handle the volume shrinkage of the entire convex R1 of the resist R. The volume shrinkage direction depends upon a type of the resist R, and a uniform shrinkage is now supposed. The shrunk resist convex R1 has the following width L3, length L4, and height H2 In the meantime, a "size" refers to one or all of the width, length, and the height.

Width $L_2 = L_1(1-a)^{1/3}$

Length $L_4 = L_2(1-a)^{1/3}$

Height $H_2 = H_1(1-a)^{1/3}$ [EQUATION 1]

Thus, the size of the concave M1 of the original M is designed to have a desired size/$(1-a)^{1/3}$. In FIG. 2B, the size of the concave M1 of the original M is determined so that the following width L3, length L4, and height H2 shown by the broken line become desired values. The convex M2 of the original M is made smaller by the increased width, length and height of the concave M1, maintaining the entire size of the original M, unlike the whole enlargement of the original M by the volume shrinkage factor. For example, if it is assumed that the resist R has a volume shrinkage factor of 10% and a desired width of 45 nm, the concave M1 of the original M may be made so that it has a width of 45.8 nm.

The volume shrinkage factor and its shrinkage direction depend upon the resist R and the UV irradiation condition, such as the irradiation intensity and the irradiation time period. For example, even for the same UV dose, the volume shrinkage factor becomes higher when the strong light is irradiated for a short time period than when the weak light is irradiated for a long time period. It is thus preferable that a relationship between the volume shrinkage factor of the resist R and the UV irradiation condition is formulated or tabled beforehand, and reflected on design pattern data of the original M.

Figure 2C:
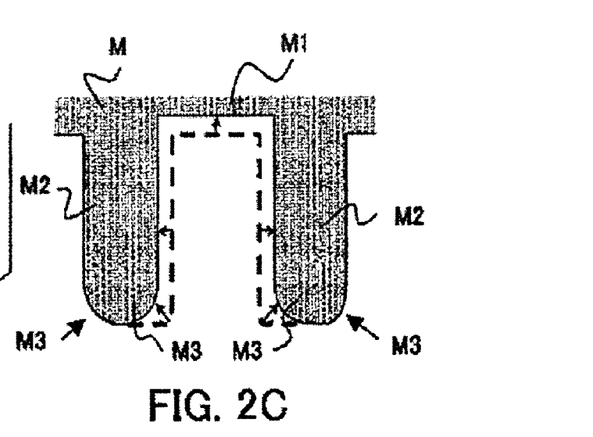

The volume shrinkage of the root R2 of the convex of the resist R results from the stress concentration associated with the cure of the UW-curing resin. As a consequence, the root R2 is likely to narrow and cause defects, such as a collapse of the pattern. One solution for this problem is a chamfer M3 provided to each edge of the convex M2 of the original M. The term "chamfer" contain both round and tapered shapes in this application. The chamfer eliminates the shrunk neck, as shown by a broken line shown in FIG. 2C, and achieves patterning that cancels out the volume shrinkage of the resist R. Here, FIG. 2C is a schematic partial section of the original M provided with the chamfer M3 at the edge of the convex M2 shown in FIG. 2B so as to handle the volume shrinkage of the root R2 of the convex of the resist R. Although this chamfer is round with a radius in FIG. 2C, its sectional shape may be expressed by one or more straight lines.

Figure 2D:
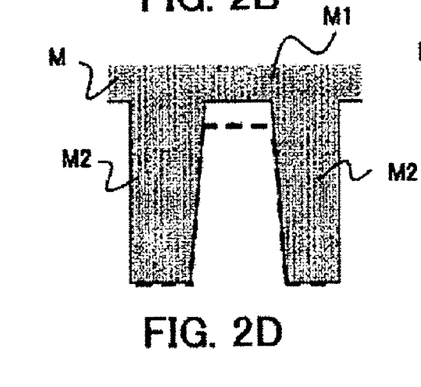
Figure 2E:
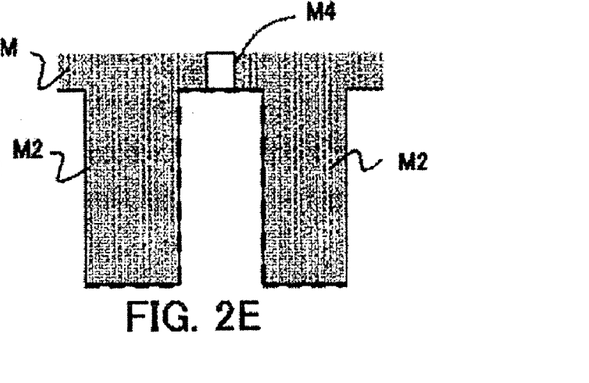

The volume shrinkage of the top R3 of the convex of the resist R in the height direction occurs because the volume shrinkage direction of the resist R is actually non-uniform due to the surface tension. Indeed, the resist R and the original M have high adhesions in both the width and length directions due to the surface tension of the pre-cured resist R, and the shrinkage in the height direction is likely to stand out. Then, the pattern lowers in the height direction and the aspect ratio with the width or length direction reduces. One solution for this problem is means for enhancing the surface tension of the resist R with a movement toward the bottom of the concave M1. This means may be configured, for example, to be a tapered shape from the opening to the bottom of the concave M1, as shown in FIG. 2D. This configuration enhances the surface tension near the bottom using the capillary attraction, increases the adhesion to the original M, and restrains the volume shrinkage of the resist R in the height direction. Alternatively, this means may be a dent (adjustment margin) M4 formed in the bottom of the concave M1, as shown in FIG. 2E. A three-dimensional structure with the adjustment margin for the volume shrinkage enhances the surface tension using the capillary attraction in the pre-curing state of the resist R, and restrains its volume shrinkage in the height direction. Here, FIGS. 2D and 2E are schematic partial sections of the originals M having different surface tension increasing means so as to handle the volume shrinkage of the top R3 of the resist R in the height direction.

The above shapes of the originals M shown in FIGS. 2C to 2E have a common characteristic in that the area of the concave M1 on the section perpendicular to the height direction decreases with a movement from the opening to the bottom of the concave M1 of the original M. The term "decrease" intends to exclude an increasing state, and permits a constant state. In other words, the width of the concave M1 on the paper plane decreases with a movement from the opening to the bottom of the concave M1 of the original M. For example, the width or sectional area of the concave M1 near the bottom is narrower (or smaller) than that around the chamfer M3 in FIG. 2C. The width or sectional area of the concave M1 near the bottom gradually decreases in a direction from the opening to the bottom of the concave M1 in FIG. 2D. The width or sectional area of the concave M1 near the bottom of the dent M4 is narrower (or smaller) than that around the opening of the concave M1 in FIG. 2E. The size and shape change configurations for the concave M1 of the original M shown in FIGS. 2B to 2E are effective singularly or in combination.

The mold driver 130 includes an original chuck 132 that holds the original M in the apparatus 100, an original stage (or imprint mechanism) 134 that positions the original M, and an original base 136 that holds the original stage 134. The original stage 134 serves as a driver that presses the original M downwardly and releases the original M upwardly in FIG. 1. The original stage 134 serves to move the original M up and down, change and control an orientation of the original M and an alignment in the rotating direction for a close contact between the original's transfer surface and the wafer W or so as to maintain the parallelism.

The magnification correction mechanism 140 compresses the original M in its radial direction using an air cylinder that operates with pressure-controlled compressed air, and is installed on the original chuck 132. Instead of or together with the air cylinder, the magnification correction mechanism 140 may be a temperature controller that heats and cools the original M. As described later, the magnification correction range of the load mechanism is about 10 ppm. The magnification correction mechanism 140 corrects a magnification by applying the load to the original M so as to cancel a magnification change caused by various processes including a heat treatment to the wafer W. In general, the magnification correction needs, for example, a range of 200 ppm.

Suppose that this range is attempted only using a load applied to the outer circumference of the quartz original M or using the expansion and shrinkage through temperature control. In applying the load to the circumference of the original M, assume that the Young's modulus is 74 GPa, the load applying sectional area is 10 mm×35 mm, and the magnification correction amount is 1 ppm. Then, the necessary load $F=AE\epsilon$ becomes 25.9 N per correction of 1 ppm from the Young's formula $\sigma=E\epsilon$, where A=10 mm×35 mm, E=74 GPa, and $\epsilon=1\times10^{-6}$, although these values are not restrictive. The load of 5,180 N is necessary for the magnification correction of 200 ppm. An application of this load to the original would cause the original to create an antiplane strain, or lower the parallelism of the pattern plane or in its turn the patterning accuracy. The temperature control needs a temperature control range of about 2° C. for a magnification correction of 1 ppm because an expansion coefficient is 5 to 6/° C. A temperature control range of about 400° C. is necessary for a magnification correction of 200 ppm using this method. The temperature control over this range would deteriorate the responsibility, throughput, and device productivity. In addition, the apparatus body becomes large and complicated, and another problem, such as a modification of a material due to the temperature occurs. In other words, it is difficult for the magnification correction mechanism 140 to correct a magnification of the original M in a wide range.

This embodiment corrects a magnification in a wider range, for example, than 10 ppm at a time different from the pattern transfer time of the original M, and corrects a magnification in a narrower range, for example, than 10 ppm in the nanoimprint apparatus 100 at the pattern transfer time. Such a magnification correction will be specifically described later.

Similar to one used for the conventional semiconductor process, the wafer W is an object onto which a pattern on the original M is to be transferred, and which is turned to a semiconductor IC through the subsequent steps. The resist R is applied onto the wafer W through a resist supplying means (not shown).

The resist supplying means (not shown) includes a tank (not shown), a nozzle (not shown), a valve (not shown), and a supply amount controller (not shown). The tank stores the resist R that is pre-cured or has not yet received the UV light. The nozzle is connected to the tank, and drops the resist R onto the wafer W plane. The valve switches between dropping of the resist R from the nozzle and stopping dropping of the resist R. The supply amount controller calculates a necessary supply amount of the resist R, and controls, based on the calculation result, a supply amount of the resist R supplied from the nozzle. For example, the supply amount controller calculates the opposing area between the original M and the wafer W using a coordinate position of the wafer stage 164, and multiplies the area by a sum of an average height of the relief pattern of the original M and an interval between the original M and the wafer W. The volume is thus calculated as the necessary supply amount. Thereby, the unnecessary resist is prevented from spilling from the wafer W, and prevented or at least restrained from contaminating a wafer chuck 162 and a wafer stage 164.

The wafer driver 160 includes the wafer chuck 162 that holds the wafer W, and the wafer stage 164 that serves to control a position and an orientation of the wafer chuck 162. The wafer stage 164 preferably has totally six axes including XYZ and ωx, ωy, and θ around these XYZ axes, enabling the entire plane of the wafer W to be transferred. The wafer stage 164 can provide highly precise positioning, and achieve an overlay between fine patterns. The wafer stage 164 includes means for controlling an orientation of the wafer W plane as well as positioning the wafer W. Thus, the wafer stage 164 can control the orientation of the wafer W plane.

An alignment mechanism 170 includes an alignment scope 172, an alignment stage 174, an off-axis scope ("OAS") 176, and a reference mark table 178 equipped with a reference mark 178a.

The alignment scope 172 is an automatic adjustment scope ("AAS") for an alignment between the original M and a shot on the wafer W. The alignment scope 172 detects positions of a mark on the original M and the reference mark 178a through the original M. The alignment stage 174 is mounted with the alignment scope 172, and drives it so that the optical axis of the alignment scope 172 is positioned at the alignment mark position on the original M. The alignment stage 174 is mounted on the original base 136. The OAS 176 measures a baseline from a detection result of a position of the reference mark 178a. After the baseline is measured, a position of the alignment mark on the wafer W is detected on the basis of the reference mark 178a. The reference mark 178a is used for an alignment among the coordinates of the OAS 176, the wafer stage 164, and the original M.

Other mechanisms not shown in FIG. 1 of the nanoimprint apparatus 100 include a stool and a damper. The stool supports the whole apparatus 100 as well as forming a reference plane for the wafer stage 164 to move. The damper eliminates the vibrations from the floor, and supports the stool.

Figure 3:
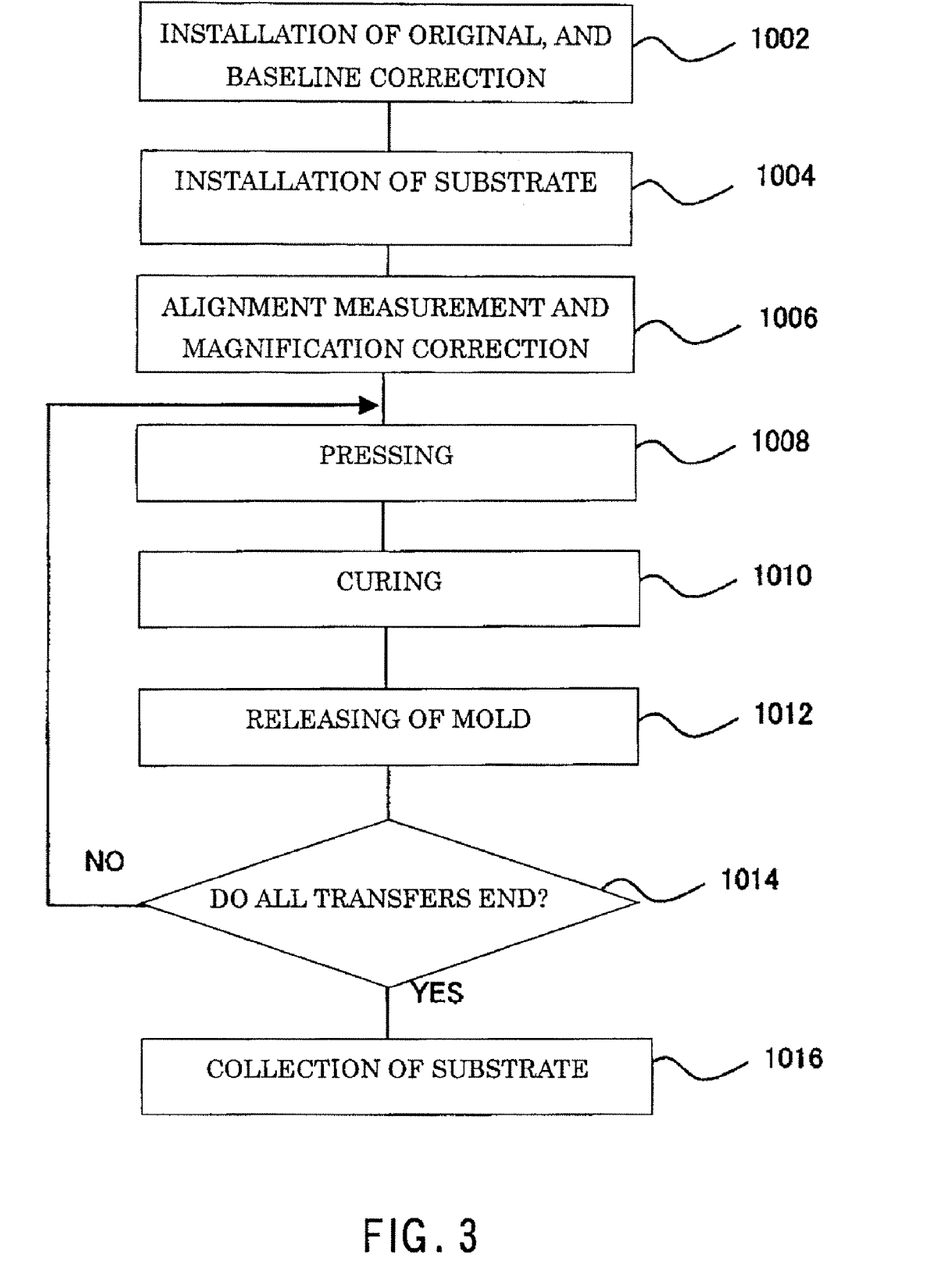
FIG. 3 is a flowchart for explaining an operation of the processing apparatus shown in FIG. 1.

Referring now to FIG. 3, a description will be given of an operation of the nanoimprint apparatus 100. Here, FIG. 3 is a flowchart for explaining the operation of the nanoimprint apparatus 100. Initially, the original M that has one or more characteristics shown in FIGS. 2B to 2E is fed and positioned, followed by a baseline correction (step 1002). The step 1002 feeds the original M using the original feeding means (not shown), measures a positional offset amount of the original M using the alignment scope 172, and corrects the positional offset by positioning the original M to the reference position using at least one of the original stage 134 and the wafer stage 164.

The baseline correction is executed in the off-axis alignment measurement so as to previously recognize the measurement axis of the OAS 176 and the position of the original M. In the baseline correction, the alignment scope 172 measures the reference mark 178a on the reference mark table 178 through the alignment mark on the original M. Next, the wafer stage 164 is driven, the reference mark 178a is measured through the OAS 176, and a correction value is calculated from an arrangement of the wafer stage 164.

Next, the wafer W (substrate) is fed (step 1004). The wafer W to be transferred is placed on the wafer chuck 162 by a wafer feeding system (not shown). The wafer chuck 162 holds the wafer W through the vacuum attraction.

Next, an alignment measurement and a magnification correction follow (step 1006). The OAS 176 sequentially measures the alignment mark on the wafer plane using the wafer stage 164 so as to highly precisely measure the position of the wafer W. Each transfer coordinate is operated from the measurement result. The magnification change of the entire wafer W is measured, and the magnification is corrected in accordance with the measurement result.

Figure 4:
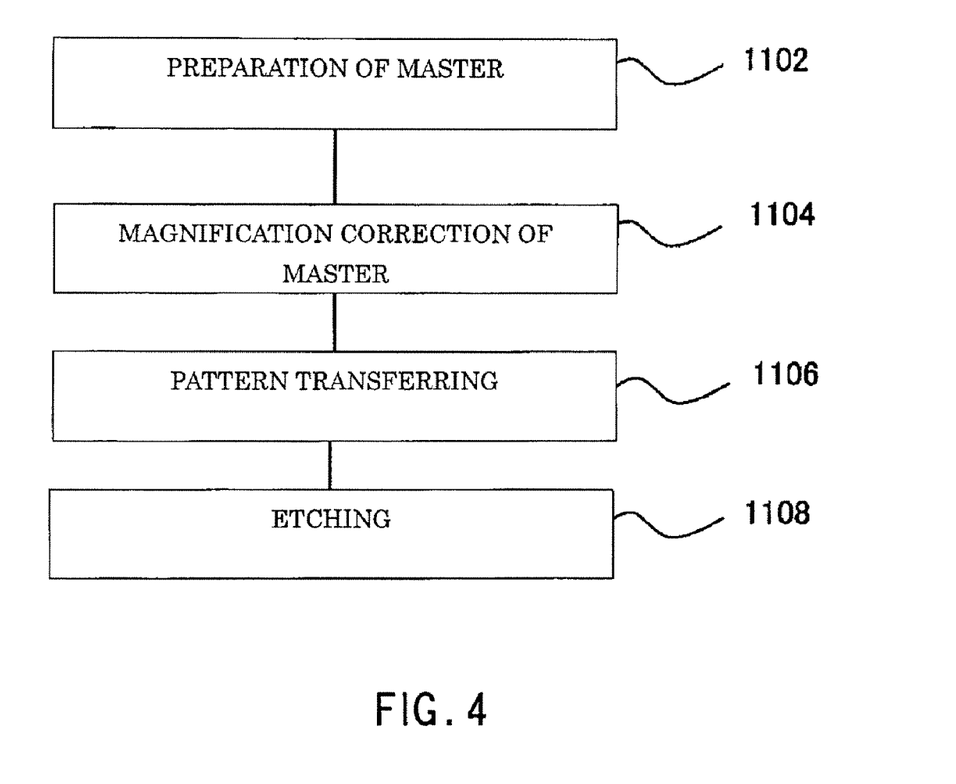
FIG. 4 is a flowchart for explaining one embodiment of a wide-range magnification correction shown in FIG. 3.
Figure 5A:
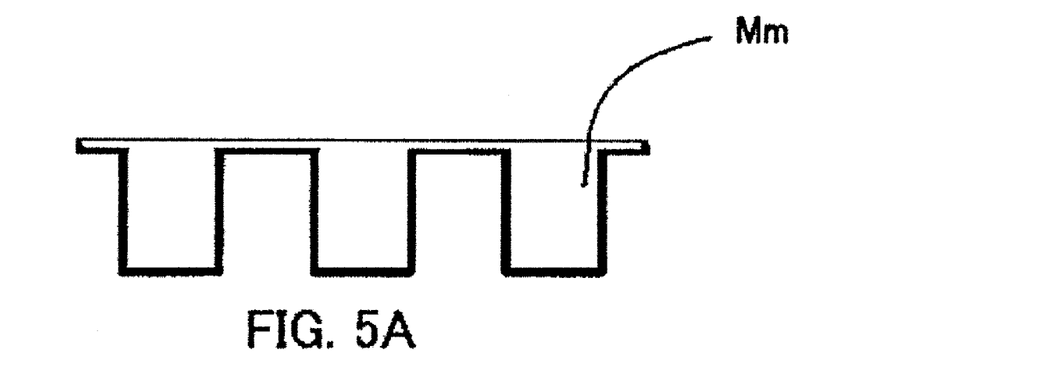
FIGS. 5A to 5D are schematic sectional views of a master (mold) and/or a daughter (mold) for explaining the wide-range magnification correction corresponding to FIG. 4.
Figure 5B:
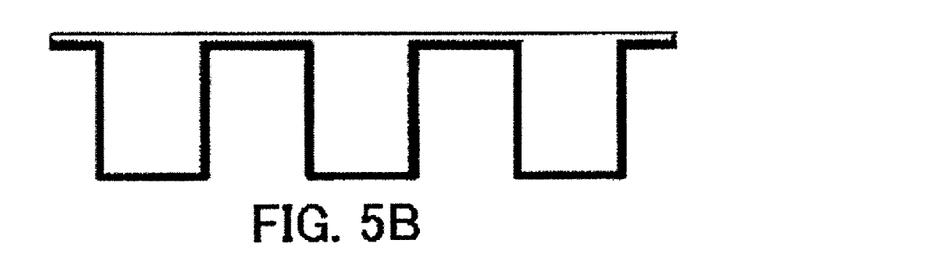
Figure 5C:
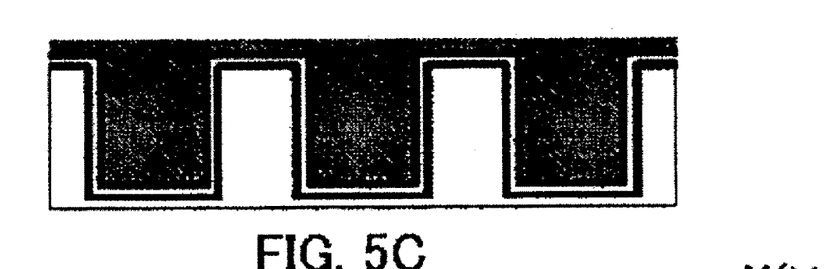
Figure 5D:
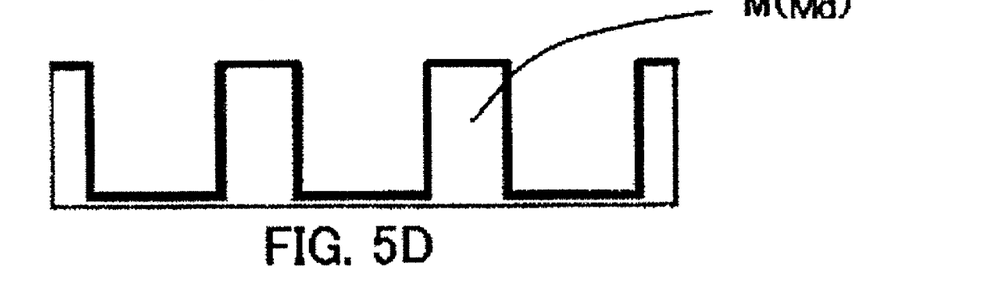

Referring now to FIGS. 4 to 5D, a description will be given of one embodiment of the magnification correction in the step 1006. Here, FIG. 4 is a flowchart for explaining the magnification correction in the step 1006. FIGS. 5A to 5D are schematic sectional views for explaining the magnification correction having a wide range. This embodiment provides a magnification correction having a wide range when the nanoimprint apparatus 100 prepares a daughter (mold) Md as the original M from a master (mold) Mm made of a material having rigidity lower than that of the daughter Md. It is preferable to consider the volume shrinkage factor of the resist R as described with reference to FIGS. 2B to 2D in preparing the daughter Md.

Initially, as shown in FIG. 5A, the master Mm is prepared with a patterning apparatus (step 1102). The master Mm has a relief pattern that is reverse to that of the daughter Md, and has the same relief shape as the pattern of the resist R to be produced in the same direction. The daughter Md is made of quartz, but the master Mm's material is not limited to quartz and may use silicon, various types of ceramics, metal, and alloys. However, the master Mm should be made of a material having rigidity lower than of the daughter Md so as to reduce the load and the temperature control range.

Next, the magnification correction mechanism 140 corrects a magnification of the master Mm by applying the load to the master Mm and/or heating or cooling the master Mm based on the alignment measurement obtained in the step 1006 or an empirical magnification correction amount (step 1104, FIG. 5B). Since the master Mm is made of the material having rigidity lower than that of the daughter Md, a necessary load or the temperature control range for the master Mm may be narrower than that for the daughter Md made of a highly rigid glass material, such as quartz. The master Mm's deformation due to magnification correction is negligible.

Next, the transfer and the etching follow (FIG. 5C). More specifically, the resist R is applied onto either the daughter Md and the master Mm, the master Mm having a corrected magnification is pressed against the resist R, and the resist R is cured through the UV irradiation (step 1106). Then, the master Mm is released from the daughter Md, the resist R is etched (step 1108), and the relief pattern is formed on the quartz substrate. Through these steps, the daughter Md is completed (FIG. 5D).

The daughter Md is not limited to a quartz substrate on which a relief pattern is formed, and may be a plane-parallel plate to which the pattern is adhered or fused. In addition, when the master Mm is not transparent to the UV light in the step 1106, the master Mm may be held on the wafer chuck 162 and the daughter Md may be held on the original chuck 132. In this case, the UV light transmits through the quartz daughter Md, and cures the resist R.

Figure 6:
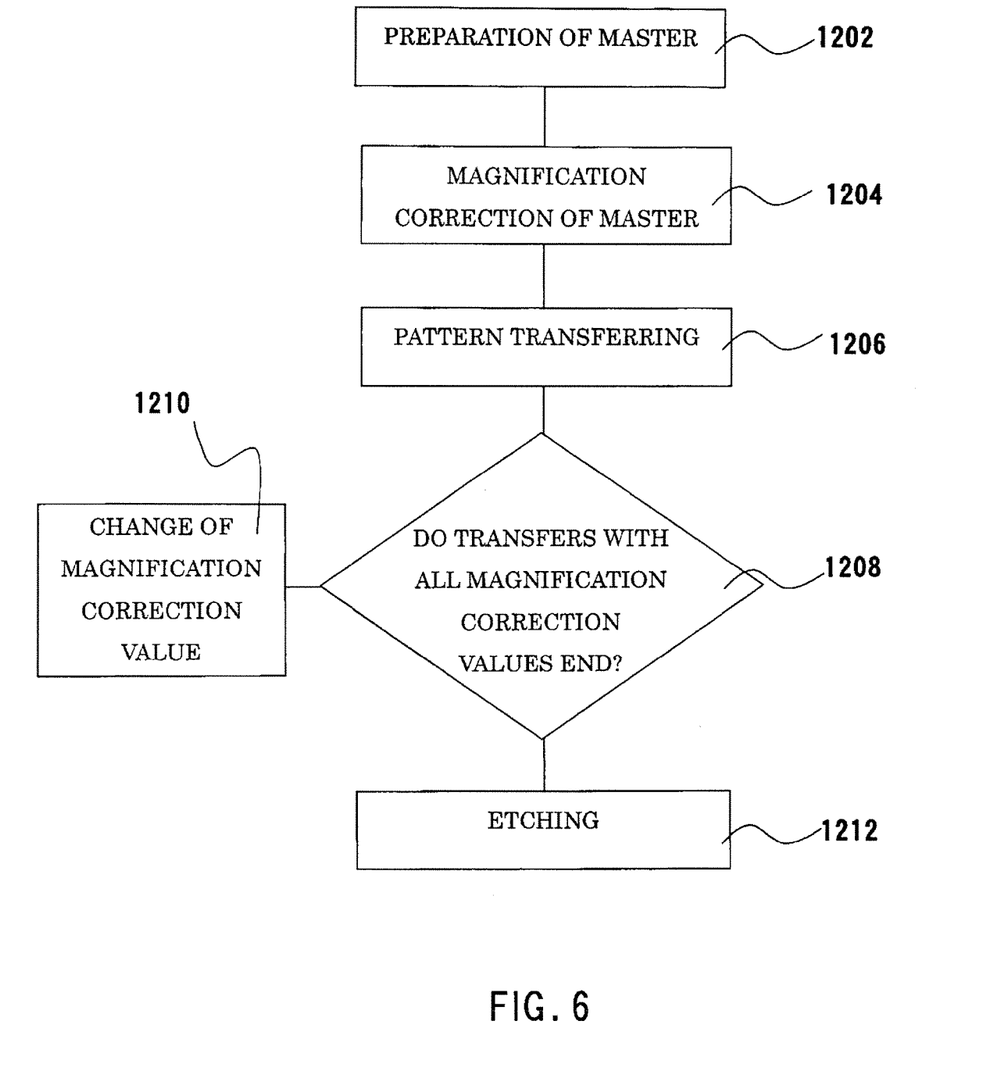
FIG. 6 is a flowchart for explaining a variation of the magnification correction shown in FIG. 4.
Figure 7A:
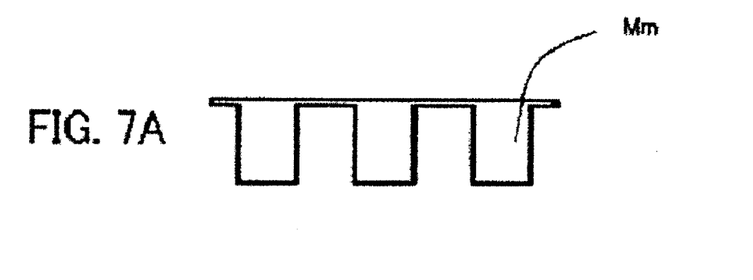
FIGS. 7A to 7D are schematic sectional views of the master and/or daughter for explaining the wide-range magnification correction corresponding to FIG. 6.
Figure 7B:
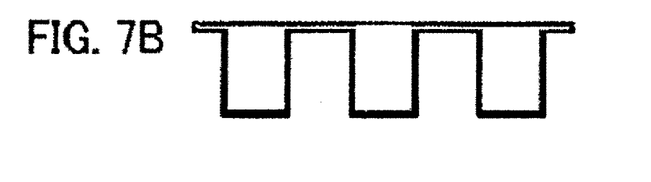
Figure 7C:
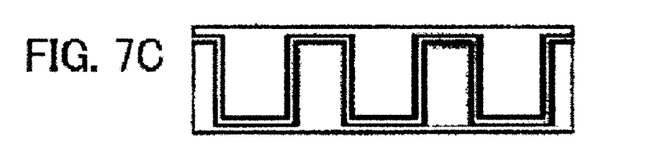
Figure 7D:
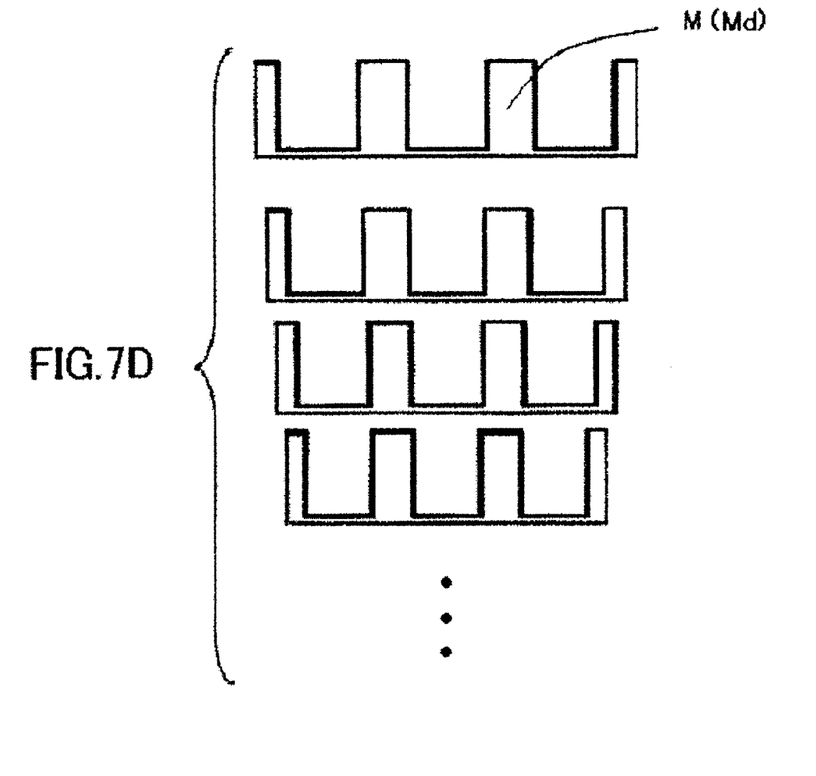

Referring now to FIGS. 6 to 7D, a description will be given of another embodiment of the magnification correction in the step 1006. Here, FIG. 6 is a flowchart for explaining the other embodiment of the magnification correction in the step 1006. FIGS. 7A to 7D are schematic sectional views for explaining the magnification correction having a wide range. This embodiment provides a magnification correction having a wide range when the nanoimprint apparatus 100 prepares the daughter Md as the original M from the master Mm made of a material having rigidity lower than that of the daughter Md.

Initially, as shown in FIG. 7A, similar to the step 1102, one kind of master Mm is prepared with a patterning apparatus (step 1202). Next, the magnification correction mechanism 140 corrects a magnification of the master Mm by a predetermined amount (step 1204, FIG. 7B). Since the master Mm is made of a material having rigidity lower than that of the daughter Md, the load or temperature control range for the master Mm is narrower than for quartz. The master Mm's deformation in magnification correction is negligible. Next, similar to the step 1106, the pattern transfer follows (FIG. 7C). It is then determined whether plural types of daughters Md having corrected magnifications are prepared (step 1208), and if a predetermined number of daughters Md having corrected magnifications are not prepared (step 1208), a magnification correction value is changed (step 1210). Thereafter, the procedure returns to the step 1204. This embodiment prepares plural daughters Md having plural types of corrected magnifications from plural (e.g., twenty) the magnification-corrected masters Mm, for example, every 10 ppm in a magnification correction range of 200 ppm. When productions of all types of magnification-corrected daughters Md are completed (step 1208), all the daughters Md are etched similar to the step 1108 (step 1212). Through these steps, daughters Md having plural types of corrected magnifications are completed (FIG. 7D).

Figure 8:
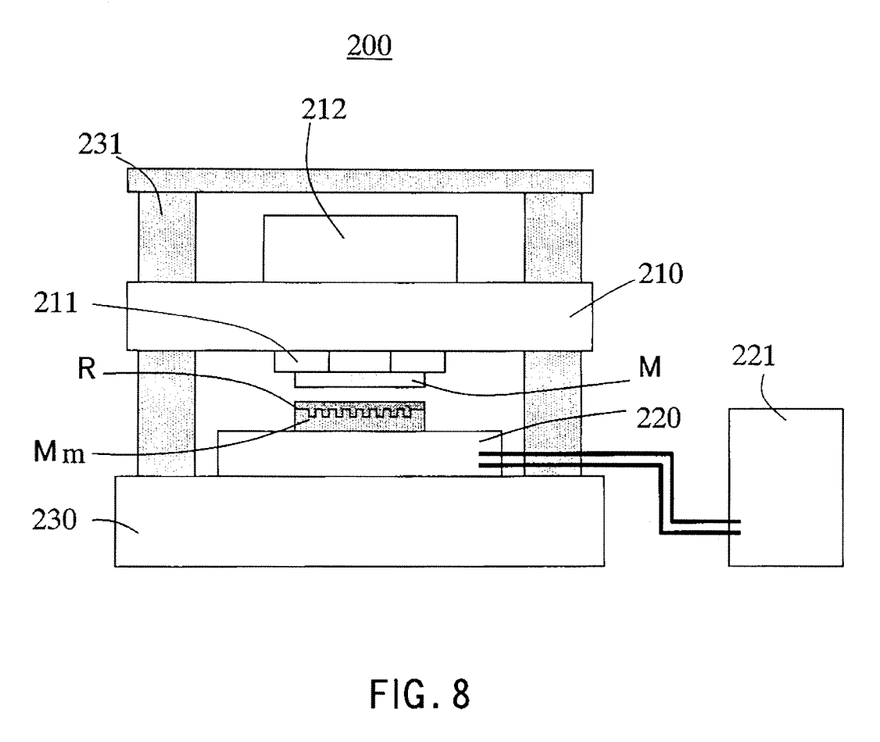
FIG. 8 is a schematic sectional view of a daughter (mold) producer.

The above embodiments use the nanoimprint apparatus 100 to prepare the daughter Md from the master Mm. On the other hand, the following embodiment uses a dedicated apparatus to prepare the daughter Md. FIG. 8 shows a daughter (mold) producer 200, which is used instead of the nanoimprint apparatus 100 for various steps of producing the daughter Md. The daughter producer 200 cures the resist R and transfers the resist shape to the daughter Md by pressing a UV transparent material such as quartz against the resist R that is applied on the master Mm and by irradiating the UV light onto the resist R. 211 denotes a mold chuck attached to a lifter 210. As the lifter 210 moves up and down, the daughter Md can be pressed against the master Mm. 212 denotes a UV irradiator installed onto the lifter 210, and includes a UV light source and illumination optics for curing the resist R. 220 denotes a master Mm holder that includes a heater/cooler mechanism and provides temperature control. 221 denotes a temperature controller that controls the temperature of the master Mm. 231 denotes a frame that serves as a guide of the lifter 210. 230 is a stool that supports the entire apparatus. In preparing the daughter, the temperature is controlled in accordance with the necessary magnification and the master's size is varied during transferring so as to prepare plural daughters having various magnifications The dedicated apparatus thus used to produce the daughter from the master maintains a sufficiently wider temperature control range than that for the nanoimprint apparatus 100, eliminating both throughput and apparatus size restrictions. Thus, the master Mm can be made of quartz.

While the above embodiments use the heat expansion and shrinkage through the temperature control, the magnification correction system can use a load application. The daughter Md can be produced from the master Mm made of a highly rigid material, such as quartz, since a magnification-correction specialized apparatus has sufficient rigidity and does not restrict the throughput.

Turning back to FIG. 3, the magnification correction in the step 1006 selects the original M from the daughter Md shown in FIG. 5D having a desired magnification correction value, or the daughter Md closest to a desired magnification correction value among the daughters Md shown in FIG. 7D. The selector may be configured, for example, so that the daughters Md having plural types of corrected magnifications are inserted into a cassette, and one of them is automatically selected from the cassette. The magnification correction mechanism 140 corrects a magnification of the original M in a narrow range. The magnification correction to the original M by magnification correction mechanism 140 is essential to the daughter Md shown in FIG. 7D, but can be necessary for the daughter Md shown in FIG. 5D due to the manufacturing errors. The wafers W that have undergone the same processes, such as a heat treatment, fall in a scattering range of about 10 ppm, and the magnification correction by the magnification correction mechanism 140 to the original M needs only such a small range. A sufficient load to be applied to the outer circumference of the original is, for example, 259 N, and the sufficient temperature control is, for example, about 20° C. As a result, the transferring precision and the throughput during the magnification correction time can be maintained.

Next, a wafer stage 164 is driven to a (transfer) position at which the original M and the first shot of the wafer W oppose to each other. Before the wafer stage 164 moves to the transfer position, the nozzle (not shown) drops a proper amount of resist R upon the transfer position. Either the wafer stage 164 or the original stage 134 is driven and the original M is pressed against the wafer W (step 1008). A load sensor (not shown) in the imprint mechanism 134 determines whether the compression ends.

After the compression ends, the illumination light is irradiated to cure the resist R (step 1010). The light irradiation means irradiates the UV, and cures the resist R between the original M and the wafer W. Since the size and shape of the concave M1 of the original M are corrected by taking into account the volume shrinkage factor of the resist R, as described with reference to FIGS. 2B to 2E, the cured resist R has the intended size and shape.

After the resist cures, at least one of the wafer stage 164 and the original stage 134 is driven to release the original M (step 1012).

Whether transfers of all the shots are completed is determined (step 1014). If not, the procedure returns to the step 1008 and similarly continues for the next transfer position or shot. If transfers of all the shots are completed (step 1014), the wafer feeding means (not shown) collects the wafer W (step 1016), and feeds in the next wafer W.

While this embodiment explains a global alignment between the original and the substrate using FIG. 3, the pressing step 1008 may use a die-by-die alignment system that provides an alignment measurement and a positioning correction for each shot. Moreover, while these embodiments discuss an off-axis alignment measurement method, the present invention is not limited to these embodiments and may use the alignment scope 172 through the original M for the alignment measurement.

Figure 9:
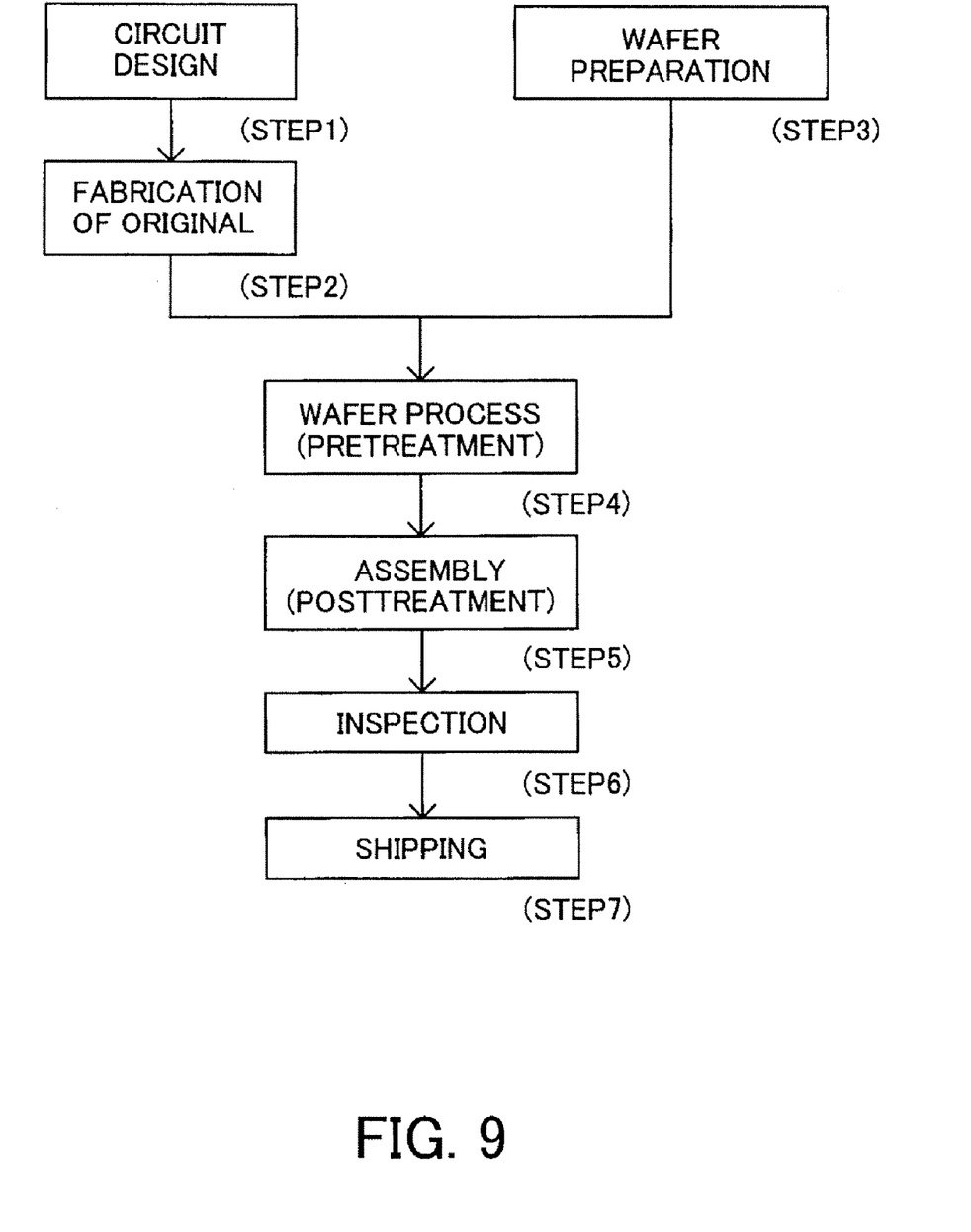
FIG. 9 is a flowchart for explaining a method for manufacturing a device (semiconductor chips such as ICs, LSIs, and the like, LCDs, CCDs, etc.) using the processing apparatus shown in FIG. 1.
Figure 10:
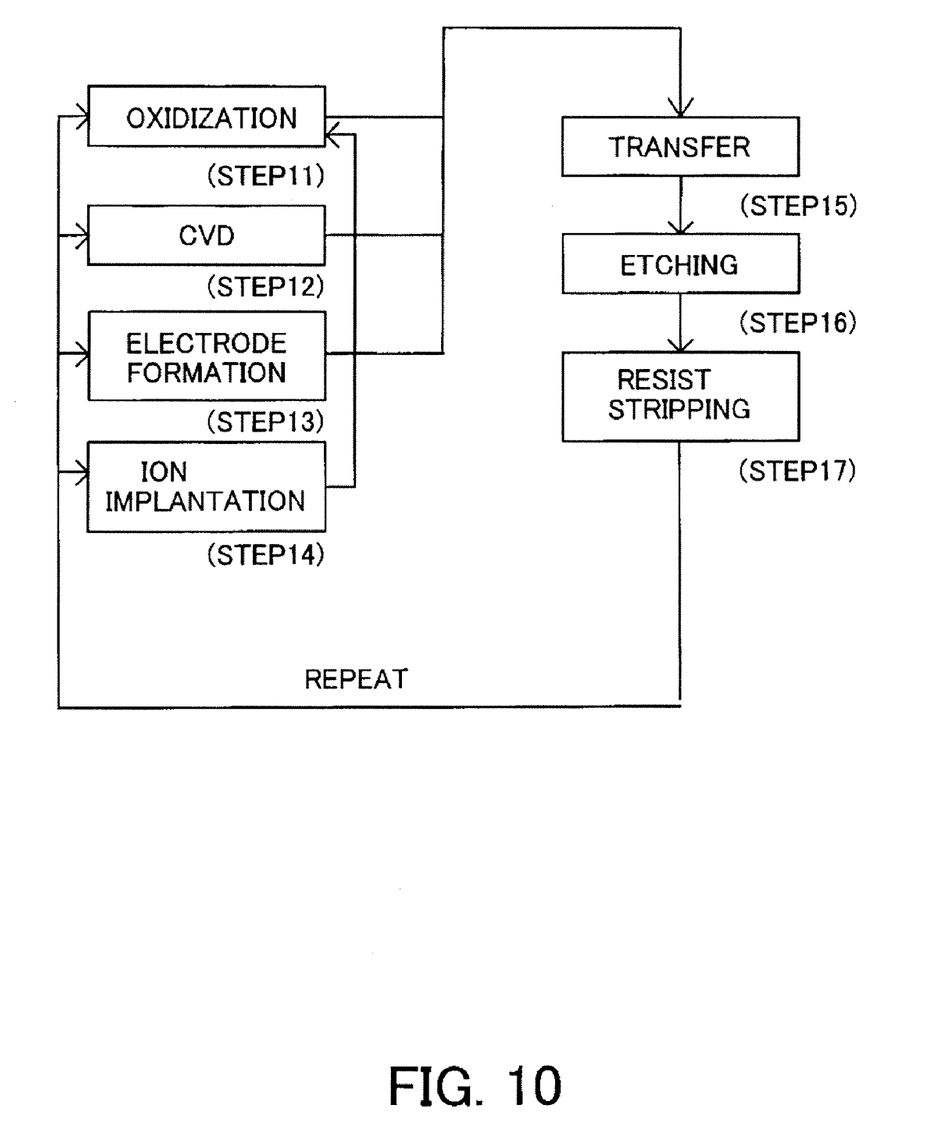
FIG. 10 is a detailed flowchart for Step 4 shown in FIG. 9.

Referring now to FIGS. 9 and 10, a description will be given of an embodiment of a device manufacturing method using the above nanoimprint apparatus. FIG. 9 is a flowchart for explaining how to fabricate devices (i.e., semiconductor chips such as IC and LSI, LCDs, CCDs, etc.). Here, a description will be given of the fabrication of a semiconductor chip as an example. Step 1 (circuit design) designs a semiconductor device circuit. Step 2 (fabrication of original) forms the original M that has a pattern that corresponds to a designed circuit pattern and is partially modified, as described with reference to FIGS. 2B to 2E. Step 3 (wafer preparation) manufactures a wafer using materials such as silicon. Step 4 (wafer process), which is also referred to as a pretreatment, forms actual circuitry on the wafer through the nanoimprint technique using the original M and wafer. Step 5 (assembly), which is also referred to as a post-treatment, forms a semiconductor chip into the wafer formed in Step 4 and includes an assembly step (dicing and bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 10 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor deposition and the like. Step 14 (ion implantation) implants ions into the wafer. Step 15 (transfer) presses the original M against the wafer while applying the resist R to the wafer W, and irradiates the UV to transfer the circuit pattern onto the wafer. Step 16 (etching) uses reactive ion etching (RIE) to complete the patterning operation. Step 17 (resist stripping) removes disused resist after etching. These steps are repeated, form multi-layer circuit patterns on the wafer, and manufacture devices (i.e., semiconductor chips, LCD devices, imaging devices (such as CCDs, etc.), thin-film magnetic heads, and the like). The inventive device manufacturing method uses a photo-curing method with a high overlay accuracy, provides a desired magnification correction, and maintains a high transferring precision by taking into consideration of the volume shrinkage during UV curing. In addition, the above embodiments do not correct a magnification of the original M in a wide range, maintains the transferring precision, and prevents the throughput deterioration. Thus, the device manufacturing method using the nanoimprint technology of this embodiment, and devices as a resultant product constitute one aspect of this invention. The present invention intends to cover devices as intermediate and final products of this device manufacturing method. Such devices include semiconductor chips such as LSI, VLSI and the like, CCDs, LCDs, magnetic sensors, thin film magnetic heads, and the like.

Further, the present invention is not limited to these preferred embodiments, and various variations and modifications may be made without departing from the scope of the present invention.

This application claims a benefit of priority based on Japanese Patent Application No. 2005-356643, filed on Dec. 9, 2005, which is hereby incorporated by reference herein in its entirety as if fully set forth herein.

What is claimed is:

1. A processing method that utilizes a processing apparatus that transfers a pattern of an original to a substrate by pressing the original against a resist that is applied to the substrate, and irradiates light for exposing the resist onto the resist via the original, said processing method comprising the steps of:
producing a first daughter to which a pattern of a master is transferred; and
producing a second daughter to which the pattern of the master is transferred, the second daughter being different in size from the first daughter, the processing apparatus using one of the first and second daughters as original,
wherein the master is made of a material less rigid than that of each of the first and second daughters, the pattern of the master being transferred to the first and second daughters at different temperatures.

2. A device manufacturing method comprising the steps of:
transferring a pattern of an original onto a resist on a substrate by using a processing method according to claim 1; and
etching the substrate.

* * * * *